US008304778B2

(12) United States Patent
Wu et al.

(10) Patent No.: US 8,304,778 B2
(45) Date of Patent: Nov. 6, 2012

(54) THIN FILM TRANSISTOR AND PIXEL STRUCTURE HAVING THE THIN FILM TRANSISTOR

(75) Inventors: Chen-Yi Wu, Taipei (TW); Yih-Chyun Kao, Changhua County (TW); Chun-Yao Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/180,555

(22) Filed: Jul. 12, 2011

(65) Prior Publication Data

US 2012/0097955 A1  Apr. 26, 2012

(30) Foreign Application Priority Data

Oct. 21, 2010  (TW) ................................ 99136001 A
May 11, 2011  (TW) .............................. 100116496 A

(51) Int. Cl.
*H01L 31/00* (2006.01)
(52) U.S. Cl. ........ 257/59; 257/57; 257/58; 257/E29.289
(58) Field of Classification Search .............. 257/57–59, 257/E29.289
See application file for complete search history.

(56) References Cited

U.S. PATENT DOCUMENTS

| 4,849,797 | A | * | 7/1989 | Ukai et al. | 257/57 |
| 5,032,883 | A | * | 7/1991 | Wakai et al. | 257/59 |
| 5,340,759 | A | * | 8/1994 | Hsieh et al. | 438/156 |
| 5,994,717 | A | * | 11/1999 | Igarashi et al. | 257/59 |
| 6,018,176 | A | * | 1/2000 | Lim | 257/302 |
| 6,144,422 | A | * | 11/2000 | Lee | 349/43 |
| 6,320,221 | B1 | * | 11/2001 | Choi et al. | 257/330 |
| 6,483,124 | B2 | * | 11/2002 | Flewitt | 257/59 |
| 6,486,935 | B1 | * | 11/2002 | Hwang et al. | 349/147 |
| 6,992,324 | B2 | * | 1/2006 | Nagayama | 257/40 |
| 7,208,756 | B2 | * | 4/2007 | Shih et al. | 257/40 |
| 7,381,984 | B2 | * | 6/2008 | Suh et al. | 257/40 |
| 7,863,611 | B2 | * | 1/2011 | Abe et al. | 257/58 |
| 7,948,171 | B2 | * | 5/2011 | Sakakura et al. | 313/506 |
| 8,097,488 | B2 | * | 1/2012 | Kawashima | 438/99 |
| 8,193,527 | B2 | * | 6/2012 | Yang | 257/40 |
| 2002/0113236 | A1 | * | 8/2002 | Park et al. | 257/61 |
| 2004/0084669 | A1 | * | 5/2004 | Lee et al. | 257/40 |
| 2005/0017302 | A1 | * | 1/2005 | Hoffman | 257/347 |
| 2005/0199959 | A1 | * | 9/2005 | Chiang et al. | 257/368 |
| 2005/0275038 | A1 | * | 12/2005 | Shih et al. | 257/382 |
| 2007/0114533 | A1 | * | 5/2007 | Luo et al. | 257/61 |
| 2007/0295965 | A1 | * | 12/2007 | Chae et al. | 257/66 |
| 2008/0024702 | A1 | * | 1/2008 | Shiau et al. | 349/114 |
| 2009/0001361 | A1 | * | 1/2009 | Shiba et al. | 257/40 |
| 2009/0026545 | A1 | * | 1/2009 | Peidous | 257/368 |
| 2009/0047750 | A1 | * | 2/2009 | Chiu et al. | 438/30 |
| 2009/0242889 | A1 | * | 10/2009 | Nakayama | 257/59 |
| 2009/0267067 | A1 | * | 10/2009 | Jinbo et al. | 257/57 |
| 2010/0102397 | A1 | * | 4/2010 | Park et al. | 257/392 |
| 2010/0117075 | A1 | * | 5/2010 | Akimoto et al. | 257/43 |

(Continued)

*Primary Examiner* — N Drew Richards
*Assistant Examiner* — Ankush Singal
(74) *Attorney, Agent, or Firm* — Jianq Chyun IP Office

(57) ABSTRACT

A thin film transistor (TFT) and a pixel structure having the TFT are provided. The TFT is configured on a substrate. Besides, the TFT includes a gate, a gate insulation layer, a source, a channel layer, and a drain. The gate insulation layer covers the gate and the substrate. The source is configured on a portion of the gate insulation layer. The channel layer is configured on the gate insulation layer and covers a portion of the source located above the gate. The drain is configured on and electrically connected to the channel layer.

20 Claims, 4 Drawing Sheets

U.S. PATENT DOCUMENTS

| | | | |
|---|---|---|---|
| 2010/0167464 A1* | 7/2010 | Yamazaki | 438/104 |
| 2010/0244070 A1* | 9/2010 | Lee et al. | 257/98 |
| 2010/0301343 A1* | 12/2010 | Qiu et al. | 257/66 |
| 2010/0330729 A1* | 12/2010 | Sugawara et al. | 438/70 |
| 2011/0140097 A1* | 6/2011 | Cheong et al. | 257/43 |
| 2011/0297937 A1* | 12/2011 | Kim et al. | 257/57 |

\* cited by examiner

THIN FILM TRANSISTOR AND PIXEL STRUCTURE HAVING THE THIN FILM TRANSISTOR

CROSS-REFERENCE TO RELATED APPLICATION

This application claims the priority benefit of Taiwan application serial no. 99136001, filed on Oct. 21, 2010. This application also claims the priority benefit of a Taiwan application serial no. 100116496, filed on May 11, 2011. The entirety of the above-mentioned patent applications is hereby incorporated by reference herein and made a part of this specification.

BACKGROUND OF THE INVENTION

1. Field of the Invention

The invention relates to a thin film transistor (TFT) and a pixel structure. More particularly, the invention relates to a TFT in which a channel length can be adjusted based on different requirements and a pixel structure having the TFT.

2. Description of Related Art

In recent years, the progress toward the semiconductor manufacturing technology leads to fast and easy fabrication of TFTs. The TFTs can be extensively applied to computer chips, cellular phone chips, thin film transistor liquid crystal displays (TFT LCDs), and so forth. The TFT in a TFT LCD can act as a charging switch or a discharging switch for controlling pixels to display images, for instance.

According to the related art, a source and a drain of the TFT are formed by patterning the same conductive layer. The horizontal distance from the source to the drain is at least 3 µm, so as to ensure that the source and the drain are separated from each other. That is to say, when one conductive material layer is patterned to form the source and the drain through performing a photolithography and etching process, the horizontal distance from the source to the drain cannot be further shortened. Hence, the channel length and the area of the TFT cannot be further reduced.

Nonetheless, owing to the increasing requirements for device characteristics of various electronic products, the TFTs need to be characterized by great current output. The restricted channel length is unfavorable to the increase in the current output, which restrains the development of the TFTs.

SUMMARY OF THE INVENTION

The invention is directed to a TFT in which a distance between a source and a drain can be adjusted based on different requirements. Here, the distance can even reach the minimum value which can be accomplished by performing a photolithography and etching process.

The invention is further directed to a pixel structure in which a TFT has a desirable current output.

The invention provides a TFT that is configured on a substrate. The TFT includes a gate, a gate insulation layer, a source, a channel layer, and a drain. The gate insulation layer covers the gate and the substrate. The source is configured on a portion of the gate insulation layer. The channel layer is configured on the gate insulation layer and covers a portion of the source located above the gate. The drain is configured on and electrically connected to the channel layer.

According to an embodiment of the invention, the TFT further includes a passivation layer. The passivation layer covers the source, the channel layer, and the gate insulation layer. Besides, the passivation layer has at least one hole that exposes a portion of the channel layer. Specifically, the drain is electrically connected to the channel layer through the hole. According to an embodiment of the invention, the hole can be located right above the gate and the channel layer.

According to an embodiment of the invention, the TFT further includes a passivation layer that covers the source, the channel layer, and the drain. The channel layer further covers the gate insulation layer, for instance.

According to an embodiment of the invention, the drain further covers the gate insulation layer.

According to an embodiment of the invention, the source contacts the channel layer at a source contact region, the drain contacts the channel layer at a drain contact region, a horizontal distance from the source contact region to the drain contact region is parallel to the substrate, and the horizontal distance is greater than or equal to zero.

According to an embodiment of the invention, the source contacts the channel layer at a source contact region, the drain contacts the channel layer at a drain contact region, a horizontal distance from the source contact region to the drain contact region is parallel to the substrate, and the horizontal distance is smaller than 3 µm.

According to an embodiment of the invention, a material of the channel layer includes a metal oxide semiconductor (MOS) or an amorphous silicon semiconductor. For instance, the MOS includes indium-gallium-zinc oxide (IGZO).

According to an embodiment of the invention, a material of the drain includes a transparent conductive material.

According to an embodiment of the invention, a material of the drain includes metal.

According to an embodiment of the invention, a material of the source and a material of the drain are the same.

The invention further provides a pixel structure that includes the aforesaid TFT and a pixel electrode. The pixel electrode is electrically connected to the drain.

According to an embodiment of the invention, the pixel electrode and the drain are in the same layer.

Based on the above, the source and the drain of the TFT are formed by different conductive layers, and the source and the drain are respectively formed before and after the channel layer is formed. The horizontal distance from the source to the drain in the TFT of the invention is not subject to the ultimate limitation imposed by the manufacturing process; therefore, the channel length can be adjusted based on different requirements, so as to accomplish ideal carrier mobility. As such, the pixel structure having the TFT of the invention can have favorable response speed.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
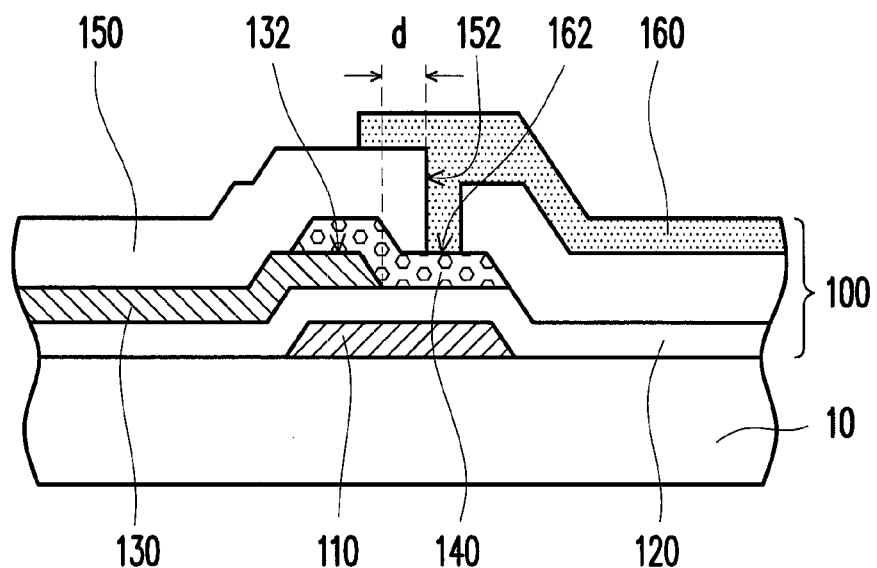
FIG. 1 is a schematic cross-sectional view illustrating a TFT according to a first embodiment of the invention.

FIG. 1 is a schematic cross-sectional view illustrating a TFT according to a first embodiment of the invention. With reference to FIG. 1, a TFT 100 is configured on a substrate 10. The TFT 100 includes a gate 110, a gate insulation layer 120, a source 130, a channel layer 140, a passivation layer 150, and a drain 160. The gate 110 is configured on the substrate 10, and the gate insulation layer 120 covers the gate 110 and the substrate 10. The source 130 is configured on a portion of the gate insulation layer 120. The channel layer 140 is configured on the gate insulation layer 120 and covers a portion of the gate insulation layer 120 and a portion of the source 130 located above the gate 110. The passivation layer 150 covers the source 130, the channel layer 140, and the gate insulation layer 120 that is not covered by the source 130 and the channel layer 140. The drain 160 is configured on the channel layer 140. The passivation layer 150 has a hole 152 that exposes a portion of the channel layer 140, such that the drain 160 is contacted to and electrically connected to the channel layer 140 through the hole 152.

In this embodiment, the gate 110, the gate insulation layer 120, the source 130, the channel layer 140, the passivation layer 150, and the drain 160 are sequentially formed. The gate 110 can be made of metal or other conductive materials. The channel layer 140 can be made of an amorphous silicon semiconductor material, a MOS material, an organic semiconductor material, and so on. Here, the MOS material can be IGZO. The source 130 and the drain 160 can be made of a conductive material, such as metal, a transparent conductive material, a metal alloy, and so on. Here, the transparent conductive material can be indium-tin oxide (ITO). The source 130 and the drain 160 formed in different steps can be made of the same material or different materials. Certainly, the above-mentioned materials are merely exemplary and should not be construed as limitations to this invention.

The source 130 and the drain 160 are formed by different layers in different manufacturing steps. The channel layer 140 is stacked onto the source 130, and the drain 160 is stacked onto the channel layer 140. Hence, the relative position of the source 130 and the drain 160 can be adjusted based on different requirements without being affected by manufacturing precision. To be more specific, the source 130 contacts the channel layer 140 at a source contact region 132, the drain 160 contacts the channel layer 140 at a drain contact region 162, a horizontal distance d from the source contact region 132 to the drain contact region 162 is parallel to the substrate 10, and the horizontal distance d can be smaller than 3 μm. In other embodiments of the invention, the horizontal distance d from the source contact region 132 to the drain contact region 162 can be greater than or equal to zero. According to the related art, the source and the drain are formed by the same conductive material layer in the same patterning process, and the distance from the source to the drain is at least 3 μm. By contrast, the relative position of the source 130 and the drain 160 in the TFT 100 according to this embodiment can be determined in a more flexible manner.

Generally, when the horizontal distance d from the source contact region 132 to the drain contact region 162 is shortened, the channel length of the TFT 100 is reduced correspondingly. On the contrary, when the horizontal distance d from the source contact region 132 to the drain contact region 162 is lengthened, the channel length of the TFT 100 is increased correspondingly. In this embodiment, the horizontal distance d from the source contact region 132 to the drain contact region 162 is not specifically restricted, and therefore the channel length of the TFT 100 can be adjusted based on different requirements. In addition, the structural design of the channel layer 140 located between the source 160 and the gate 110 is conducive to alleviation of the capacitance coupling effect between the drain 160 and the gate 110. As such, the gate-drain parasitic capacitance of the TFT 100 is rather small, which contributes to improvement of electrical performance of the TFT 100.

Figure 2:
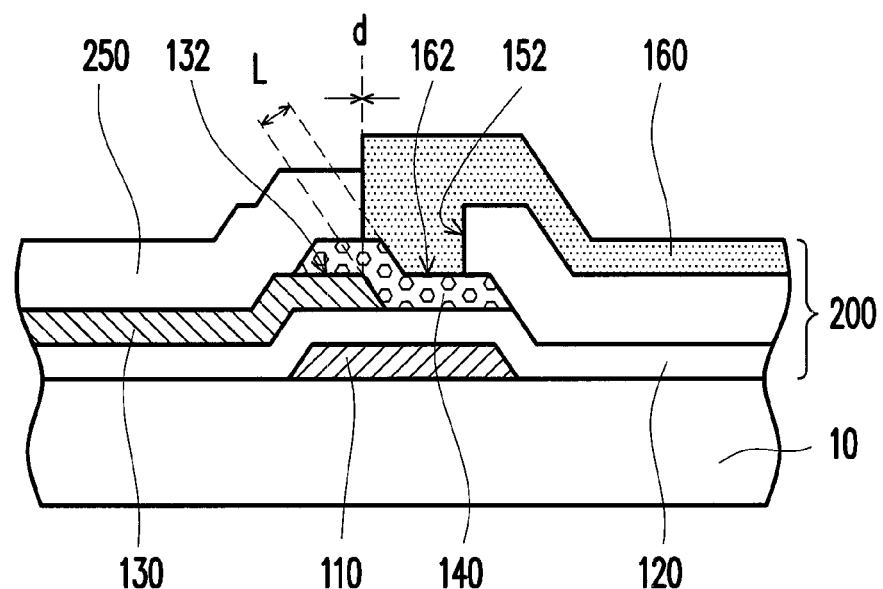
FIG. 2 is a schematic cross-sectional view illustrating a TFT according to a second embodiment of the invention.

FIG. 2 is a schematic cross-sectional view illustrating a TFT according to a second embodiment of the invention. With reference to FIG. 2, a TFT 200 is configured on a substrate 10. The TFT 200 includes a gate 110, a gate insulation layer 120, a source 130, a channel layer 140, a passivation layer 250, and a drain 160. The gate 110 is configured on the substrate 10, and the gate insulation layer 120 covers the gate 110 and the substrate 10. The source 130 is configured on a portion of the gate insulation layer 120. The channel layer 140 is configured on the gate insulation layer 120 and covers a portion of the source 130 located above the gate 110. The passivation layer 250 covers the source 130, the channel layer 140, and the gate insulation layer 120 that is not covered by the source 130 and the channel layer 140. The drain 160 is configured on the channel layer 140. Besides, the passivation layer 250 has a hole 152 through which the drain 160 is contacted with the channel layer 140 and electrically connected to the channel layer 140.

Note that the main difference between this embodiment and the first embodiment lies in the position of the hole 152 in the passivation layer 250. According to this embodiment, the hole 152 is located right above the gate 110 and the channel layer 140, for instance. Here, the source 130 contacts the channel layer 140 at a source contact region 132, the drain 160 contacts the channel layer 140 at a drain contact region 162, a horizontal distance d from the source contact region 132 to the drain contact region 162 is parallel to the substrate 10, and the horizontal distance d is zero, for instance. As such, the channel length L of the TFT 200 can be determined based on the thickness of the channel layer 140. The channel length L of the TFT 200 can be effectively reduced in order to increase the carrier mobility, such that the TFT 200 can be equipped with the required device characteristics.

The source 130 and the drain 160 formed in different steps can be made of the same material or different materials. For example, the source 130 and the drain 160 can be made of metal, a transparent conductive material, a metal alloy, and so on. Here, the transparent conductive material can be ITO. Namely, one of the source 130 and the drain 160 can be made of metal, and the other is made of the transparent conductive material. In an alternative embodiment, both the source 130 and the drain 160 can be made of metal or the transparent conductive material.

Figure 3:
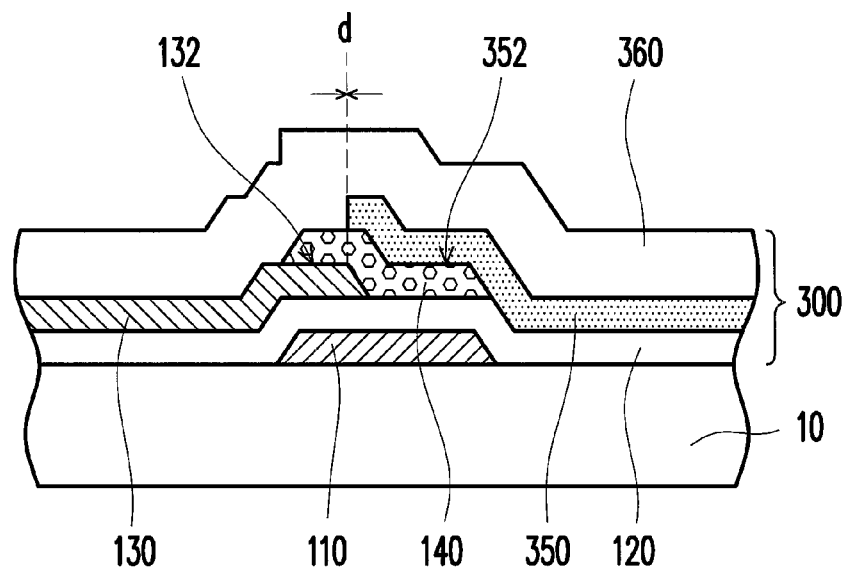
FIG. 3 is a schematic cross-sectional view illustrating a TFT according to a third embodiment of the invention.

FIG. 3 is a schematic cross-sectional view illustrating a TFT according to a third embodiment of the invention. With reference to FIG. 3, the TFT 300 is configured on a substrate 10 and includes a gate 110, a gate insulation layer 120, a source 130, a channel layer 140, and a drain 350 that are sequentially stacked onto the substrate 10. The TFT 300 further includes a passivation layer 360 that covers the source 130, the channel layer 140, and the drain 350. In this embodiment, the source 130 contacts the channel layer 140 at one side of the channel layer 140 close to the substrate 10, while the drain 350 contacts the channel layer 140 at the other side of the channel layer 140 away from the substrate 10. Since the source 130 and the drain 350 are formed by different layers in different steps, the source 130 and the drain 350 can be made of the same material or different materials.

Additionally, the relative position of the source 130 and the drain 350 is not subject to manufacturing precision. The source 130 contacts the channel layer 140 at a source contact region 132, the drain 350 contacts the channel layer 140 at a drain contact region 352, a horizontal distance d from the source contact region 132 to the drain contact region 352 is parallel to the substrate 10, and the horizontal distance d from the source contact region 132 to the drain contact region 352 can be greater than or equal to zero. Hence, the horizontal distance d can be adjusted based on required device characteristics, so as to ensure that the channel length complies with actual demands. Moreover, the channel layer 140 is configured between the gate 110 and the drain 350 of the TFT 300. Therefore, the gate-drain parasitic capacitance of the TFT 300 is small, and the TFT 300 can have the desirable electrical performance.

Figure 4:
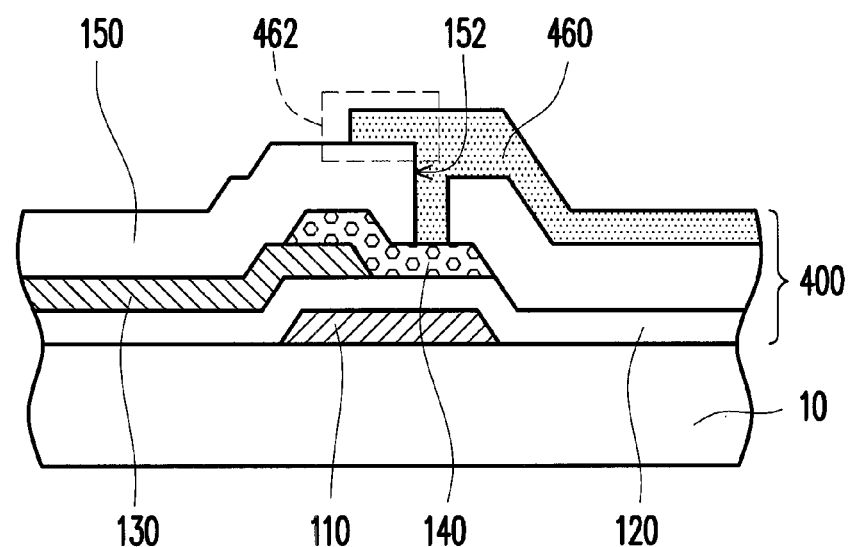
FIG. 4 is a schematic cross-sectional view illustrating a TFT according to a fourth embodiment of the invention.

FIG. 4 is a schematic cross-sectional view illustrating a TFT according to a fourth embodiment of the invention. With reference to FIG. 4, the TFT 400 is configured on a substrate 10 and includes a gate 110, a gate insulation layer 120, a source 130, a channel layer 140, a passivation layer 150, and a drain 460. The TFT 400 is approximately the same as the TFT 100, while the main difference therebetween lies in that the drain 460 further includes an extension portion 462. The extension portion 462 of the drain 460 is located right above the gate 110 and the channel layer 140, for instance. The passivation layer 150 is located between the extension portion 462 and the channel layer 140, which additionally gives rise to the dual-gate effect and ensures great current output.

The source 130 and the drain 460 of the TFT 400 are formed by different layers, and therefore the relative position of the source 130 and the drain 460 is not subject to manufacturing precision. When the TFT 400 is fabricated, the relative position of the source 130 and the drain 460 can be modified based on actual requirements, so as to obtain the desirable channel length. Besides, when the distance from the source 130 to the drain 460 is shortened, the area of the TFT 400 is correspondingly reduced, which is conducive to improvement of component density in the device.

Figure 5:
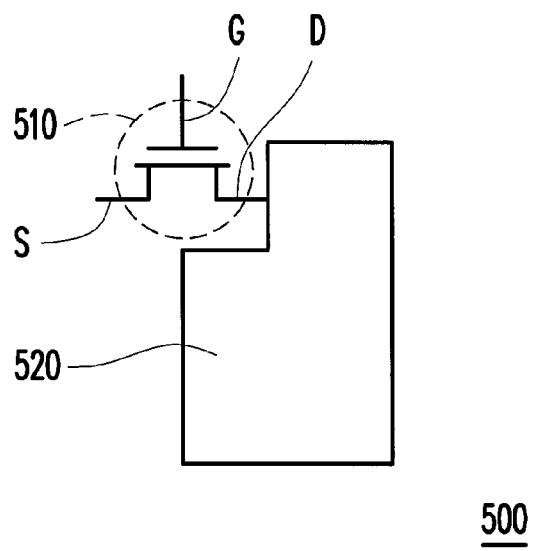
FIG. 5 is a schematic view illustrating a pixel structure according to an embodiment of the invention.

FIG. 5 is a schematic view illustrating a pixel structure according to an embodiment of the invention. With reference to FIG. 5, the pixel structure 500 includes a TFT 510 and a pixel electrode 520. The TFT 510 includes a gate G, a source S, and a drain D. The pixel electrode 520 is electrically connected to the drain D. In particular, the cross-sectional design of the TFT 510 can be the same as any of the design of the TFTs 100, 200, 300, and 400 described in the previous embodiments. That is to say, the source S and the drain D are formed by different layers, and the source S and the drain D can be made of the same material or different materials. Through modifying the relative position of the source S and the drain D, the TFT 510 can have different channel length and is not subject to manufacturing precision. As such, the TFT 510 can have satisfactory electrical performance, and thereby the response speed of the pixel structure 500 can comply with actual requirements.

In this embodiment, the pixel electrode 520 can be made of a transparent conductive material, metal, or a combination thereof. The pixel electrode 520 and the drain D can be simultaneously formed, and thus the pixel electrode 520 and the drain D can be made of the same material. Note that the pixel electrode 520 and the drain D need not be formed at the same time according to this embodiment. Namely, in other embodiments of the invention, the pixel electrode 520 and the drain D can be formed in different manufacturing steps.

Figure 6:
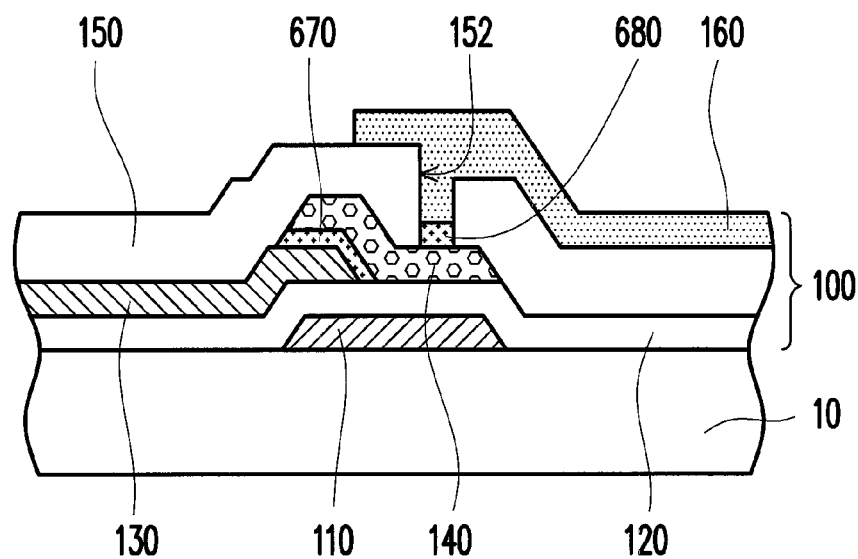
FIG. 6 is a schematic view illustrating a TFT according to a fifth embodiment of the invention.

FIG. 6 is a schematic view illustrating a TFT according to a fifth embodiment of the invention. Referring to FIG. 6, a thin film transistor (TFT) 600 is disposed on a substrate 10. The TFT 600 includes a gate 110, a gate insulation layer 120, a source 130, a channel layer 140, a passivation layer 150, a drain 160, and a buffer layers 670 and 680. The relative positions of the gate 110, the gate insulation layer 120, the source 130, the channel layer 140, the passivation layer 150, and the drain 160 can be referred to those described in the first embodiment. Specifically, the buffer layer 670 is disposed between the source 130 and the channel layer 140, while the buffer layer 680 is disposed between the drain 160 and the channel layer 140. The source 130 is connected with the channel layer 140 through the buffer layer 670 and the drain 680 is connected with the channel layer 140 through the buffer layer 480. Accordingly, the source 130 and the drain 160 in the present embodiment do not directly contact with the channel layer 140, optionally. Namely, the buffer layers 670 and 680 are respectively sandwiched between the source 130 and the channel layer 140 and between the drain 160 and the channel layer 140.

The material of the buffer layers 670 and 680 can be any semiconductor material allowing the ohmic contact between the source 130/drain 160 made by metal material and the channel layer 140 made by oxide semiconductor material, such as n+ doped IGZO. Therefore, the disposition of the buffer layers 670 and 670 is conducive to the reduction of the contacting resistance when the source 130 and the drain 160 connect with the channel layer 140. The buffer layers 670 and 680 can be fabricated by using the mask for forming the source 130 and the drain 160, or by using alternative mask.

Figure 7:
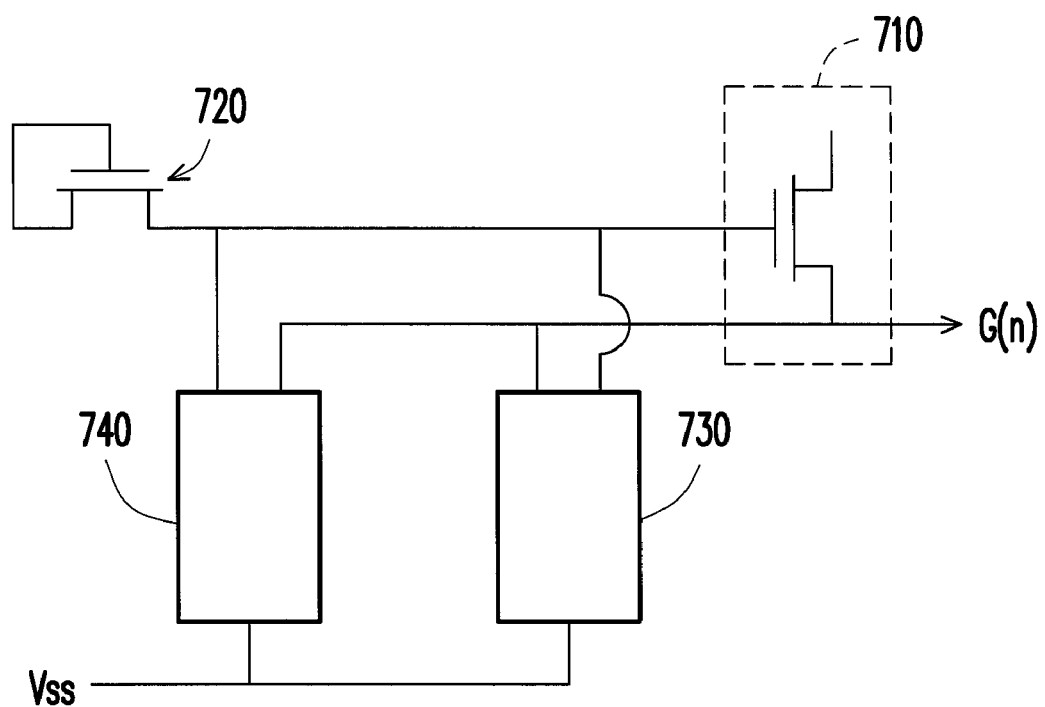
FIG. 7 is a schematic view illustrating a circuit structure according to an embodiment of the invention.

It is noted that the buffer layer 670 and 680 can be selectively applied in the TFTs of the aforesaid first to fourth embodiments as well as be applied in the TFT of the pixel structure depicted in FIG. 5, such that the contacting resistance between the metal material and the oxide semiconductor material can be reduced. Alternately, the TFT 600 according to the present embodiment can be applied in other circuit structures such the circuit structure illustrated in FIG. 7. The circuit structure 700 depicted in FIG. 7 includes TFTs 710, 720, and modules 730, 740. The TFT 71—can be, for example, any one TFT described in the aforesaid embodiments and the TFTs 710 and 720 are connected with the module 730 and the module 740. In addition, the module 730 and the module 740 are connected with the power Vss and the line G(n), for instance. Certainly, the circuit structure 700 mentioned above is merely taken as an example, and the TFTs described in the above embodiments can be applied in other circuit design or other pixel structures.

In light of the foregoing, according to this invention, the source and the drain are formed by different layers, and the source and the drain are respectively formed before and after the channel layer is formed. The channel length of the TFT is not subject to manufacturing precision. Hence, the channel length of the TFT can be designed in a flexible manner and can even be reduced to the thickness of the channel layer. On the other hand, the horizontal distance from the source to the drain can be further reduced to about zero, which is conducive to reduction of the area of the TFT. In conclusion, the TFT of this invention has favorable design flexibility, and the pixel structure using the TFT of this invention can have desirable response speed.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A thin film transistor configured on a substrate, the thin film transistor comprising:
   a gate;
   a gate insulation layer covering the gate and the substrate;
   a source configured on a portion of the gate insulation layer;
   a channel layer configured on the gate insulation layer and covering a portion of the source located above the gate; and
   a drain configured on and electrically connected to the channel layer.

2. The thin film transistor as claimed in claim 1, further comprising a buffer layer between the source and the channel layer, and between the drain and the channel layer for lower contact resistance.

3. The thin film transistor as claimed in claim 1, further comprising a passivation layer covering the source, the channel layer, and the gate insulation layer, the passivation layer having at least one hole exposing a portion of the channel layer.

4. The thin film transistor as claimed in claim 1, further comprising a passivation layer covering the source, the channel layer, and the drain.

5. The thin film transistor as claimed in claim 1, wherein the source contacts the channel layer at a source contact region, the drain contacts the channel layer at a drain contact region, a horizontal distance from the source contact region to the drain contact region is parallel to the substrate, and the horizontal distance is greater than or equal to zero.

6. The thin film transistor as claimed in claim 1, wherein the source contacts the channel layer at a source contact region, the drain contacts the channel layer at a drain contact region, a horizontal distance from the source contact region to the drain contact region is parallel to the substrate, and the horizontal distance is smaller than 3 µm.

7. The thin film transistor as claimed in claim 1, wherein a material of the channel layer comprises a metal oxide semiconductor or an amorphous silicon semiconductor.

8. The thin film transistor as claimed in claim 1, wherein a material of the drain comprises a transparent conductive material.

9. The thin film transistor as claimed in claim 1, wherein a material of the drain comprises metal.

10. The thin film transistor as claimed in claim 1, wherein a material of the source and a material of the drain are the same.

11. A pixel structure comprising:
    the thin film transistor as claimed in claim 1; and
    a pixel electrode electrically connected to the drain.

12. A circuit structure comprising the thin film transistor as claimed in claim 1.

13. The thin film transistor as claimed in claim 3, wherein the drain is electrically connected to the channel layer through the at least one hole.

14. The thin film transistor as claimed in claim 3, wherein the drain further comprising an extension portion configured right above the gate and the channel layer.

15. The thin film transistor as claimed in claim 3, wherein the at least one hole is located right above the gate and the channel layer.

16. The thin film transistor as claimed in claim 14, wherein the passivation layer is located between the extension portion and the channel layer.

17. The thin film transistor as claimed in claim 4, wherein the channel layer further covers the gate insulation layer.

18. The thin film transistor as claimed in claim 4, wherein the drain further covers the gate insulation layer.

19. The thin film transistor as claimed in claim 7, wherein the metal oxide semiconductor comprises indium-gallium-zinc oxide.

20. The pixel structure as claimed in claim 11, wherein the pixel electrode and the drain are in a same layer.

* * * * *